United States Patent
Lim et al.

(10) Patent No.: US 8,664,111 B2
(45) Date of Patent: Mar. 4, 2014

(54) METHOD OF PATTERNING A SEMICONDUCTOR DEVICE WITH HARD MASK

(75) Inventors: Ha-Jin Lim, Seoul (KR); Moon-Han Park, Yongin-si (KR); Eun-Gon Kim, Hwaseong-si (KR); Jin-Ho Do, Yongin-si (KR); Weon-Hong Kim, Suwon-si (KR); Moon-Kyun Song, Anyang-si (KR); Dae-Kwon Joo, Osan-si (KR)

(73) Assignee: Samsung Electronic Co., Ltd. (KR)

( * ) Notice: Subject to any disclaimer, the term of this patent is extended or adjusted under 35 U.S.C. 154(b) by 140 days.

(21) Appl. No.: 13/249,505

(22) Filed: Sep. 30, 2011

(65) Prior Publication Data

US 2012/0083111 A1 Apr. 5, 2012

(30) Foreign Application Priority Data

Oct. 4, 2010 (KR) .................. 10-2010-0096470

(51) Int. Cl.
*H01L 21/4763* (2006.01)
(52) U.S. Cl.
USPC .......................... 438/634; 438/669

(58) Field of Classification Search
USPC .................................... 438/59, 634
See application file for complete search history.

(56) References Cited

U.S. PATENT DOCUMENTS

| 2002/0192900 | A1 | 12/2002 | Athavale et al. |
| 2010/0178772 | A1* | 7/2010 | Lin et al. ............. 438/703 |
| 2010/0301427 | A1* | 12/2010 | Lenski et al. ............. 257/392 |

FOREIGN PATENT DOCUMENTS

| JP | 2000-277520 | | 10/2000 |
| JP | 2000277520 | A * | 10/2000 |
| KR | 1020040006472 | A | 1/2004 |
| KR | 1020070094807 | A | 9/2007 |

* cited by examiner

*Primary Examiner* — Ajay K Arora
(74) *Attorney, Agent, or Firm* — Myers Bigel Sibley & Sajovec, P.A.

(57) ABSTRACT

There is provided a method of manufacturing a semiconductor device. In the method, a gate insulation layer including a high-k dielectric material is formed on a substrate. An etch stop layer is formed on the gate insulation layer. A metal layer is formed on the etch stop layer. A hard mask including amorphous silicon is formed on the metal layer. The metal layer is patterned using the hard mask as an etching mask to form a metal layer pattern.

8 Claims, 11 Drawing Sheets

METHOD OF PATTERNING A SEMICONDUCTOR DEVICE WITH HARD MASK

CROSS-REFERENCE TO RELATED APPLICATIONS

This application claims priority under 35 USC §119 to Korean Patent Application No. 10-2010-0096470, filed on Oct. 4, 2010 in the Korean Intellectual Property Office (KIPO), the contents of which are herein incorporated by reference in their entirety.

BACKGROUND

In order to reduce a leakage current through a gate insulation layer of a transistor, a method of forming the gate insulation layer using a high-k material has been developed. However, when a gate electrode including polysilicon is formed directly on the gate insulation layer including the high-k material, the transistor may have an increased threshold voltage and decreased electron mobility due to the Fermi-level pinning effect. Thus, a transistor having a gate electrode including a metal has been developed. However, a method of manufacturing a transistor having good electrical performance is still needed.

SUMMARY

Example embodiments provide methods of manufacturing a semiconductor device having good electrical performance.

According to some embodiments, there are provided methods of manufacturing a semiconductor device. In such methods, a gate insulation layer including a high-k dielectric material is formed on a substrate. An etch stop layer is formed on the gate insulation layer. A metal layer is formed on the etch stop layer. A hard mask including amorphous silicon is formed on the metal layer. The metal layer is patterned using the hard mask as an etching mask to form a metal layer pattern.

In some embodiments, the etch stop layer may be formed using tantalum and/or a tantalum nitride.

In some embodiments, the etch stop layer may be formed to have a thickness of less than about 20 Å.

In some embodiments, the metal layer may be formed using titanium, titanium nitride, tungsten, tantalum and/or ruthenium.

In some embodiments, a hard mask layer including amorphous silicon may be formed on the metal layer. A photoresist pattern may be formed on the hard mask layer. The hard mask layer may be patterned using the photoresist pattern as an etching mask.

In some embodiments, the hard mask layer may be patterned by performing a first wet etching process using an etching solution including ammonia water.

In some embodiments, the hard mask layer may be patterned by further performing a second wet etching process using an etching solution including hydrogen fluoride, before performing the first wet etching process.

In some embodiments, the metal layer may be patterned by performing a wet etching process using an etching solution including ammonia, hydrogen peroxide and distilled water.

In some embodiments, the hard mask may be removed. A polysilicon layer may be formed on the metal layer pattern and the etch stop layer. The polysilicon layer, the metal layer pattern, the etch stop layer and the gate insulation layer may be patterned to form a gate structure.

According to some embodiments, there are provided methods of manufacturing semiconductor devices. In such methods, a gate insulation layer including a high-k dielectric material is formed on a substrate which may be divided into a first region and a second region. An etch stop layer is formed on the gate insulation layer. A metal layer is formed on the etch stop layer. A hard mask including amorphous silicon is formed on the metal layer. The metal layer is removed using the hard mask as an etching mask until the etch stop layer is exposed to form a first metal layer pattern on the etch stop layer in the first region. The hard mask is removed. A second metal layer is formed on the first metal layer pattern and the etch stop layer. A polysilicon layer is formed on the second metal layer. The polysilicon layer, the second metal layer, the first metal layer pattern, the etch stop layer and the gate insulation layer are patterned to form first and second gate structures in the first and second regions, respectively.

In some embodiments, a hard mask layer including amorphous silicon may be formed on the metal layer. A photoresist pattern may be formed on the hard mask layer in the first region. The hard mask layer may be patterned using the photoresist pattern as an etching mask.

In some embodiments, the hard mask layer may be patterned by performing a first wet etching process using an etching solution including ammonia water.

In some embodiments, the hard mask layer may be patterned by further performing a second wet etching process using an etching solution including hydrogen fluoride, before performing the first wet etching process.

In some embodiments, the metal layer may be removed by performing a wet etching process using an etching solution including ammonia, hydrogen peroxide and distilled water.

In some embodiments, the etch stop layer may be formed using tantalum or tantalum nitride.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

DESCRIPTION OF EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

The present disclosure will now be described more fully hereinafter with reference to the accompanying drawings, in which some embodiments of the inventive concept are shown. This disclosure, however, may be embodied in many different forms and should not be construed as limited to the embodiments set forth herein. Rather, these embodiments are provided, so that this disclosure will be thorough and complete, and will fully convey the scope of the inventive concept to those skilled in the art.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 7 are cross-sectional views illustrating methods of manufacturing a semiconductor device in accordance with some embodiments disclosed herein.

Figure 1:
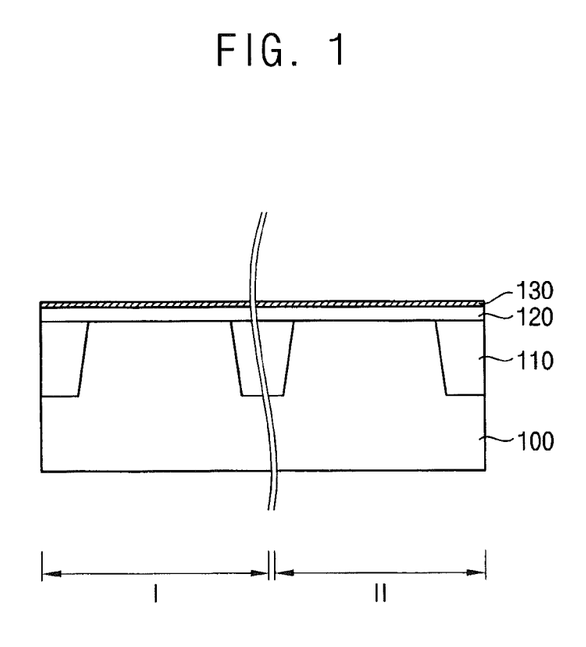
FIGS. 1 to 7 are a cross-sectional view illustrating methods of manufacturing a semiconductor device in accordance with some embodiments disclosed herein.

Referring to FIG. 1, a gate insulation layer 120 and an etch stop layer 130 may be sequentially formed on a substrate 100 having an isolation layer pattern 110 thereon.

The substrate 100 may include a silicon substrate, a germanium substrate, a silicon-germanium substrate or a silicon-on-insulator (SOI) substrate. The substrate 100 may include a first region I and a second region II. In some embodiments, a positive-channel metal oxide semiconductor (PMOS) transistor may be formed on the substrate 100 in the first region I and a negative-channel metal oxide semiconductor (NMOS) transistor may be formed on the substrate 100 in the second region II. An n-type well (not shown) may be further formed at a portion of the substrate 100 in the first region I by doping n-type impurities thereinto. A p-type well (not shown) may be further formed on the substrate 100 in the second region II by doping p-type impurities thereinto. In some embodiments, the isolation layer pattern 110 may be formed by a shallow trench isolation (STI) process so that an active region and a field region may be defined in the substrate 100.

The gate insulation layer 120 may be formed using a high-k dielectric material. In some embodiments, the gate insulation layer 120 may be formed by sequentially forming a low-k dielectric layer and a high-k dielectric layer on the substrate 100.

The low-k dielectric layer may be formed using silicon oxide or silicon oxynitride. In some embodiments, the low-k dielectric layer may be formed to include silicon oxide by performing a thermal oxidation process on an upper surface of the substrate 100. Some embodiments provide that the low-k dielectric layer may be formed to include silicon oxynitride by further performing a plasma nitration process and/or a thermal nitration process on the upper surface of the substrate 100.

The high-k dielectric layer may be formed using a metal oxide or a metal oxynitride having a high dielectric constant by a chemical vapor deposition (CVD) process, an atomic layer deposition (ALD) process and/or a sputtering process. In some embodiments, the high-k dielectric layer may be formed using hafnium oxide, hafnium silicon oxide, zirconium oxide, zirconium silicon oxide, hafnium oxynitride, hafnium silicon oxynitride, zirconium oxynitride, zirconium silicon oxynitride, aluminum oxide, hafnium aluminum oxide, hafnium lanthanum oxide, zirconium aluminum oxide, aluminum oxynitride, hafnium aluminum oxynitride, hafnium lanthanum oxynitride, and/or zirconium aluminum oxynitride, among others. These may be used alone or in a combination thereof.

The etch stop layer 130 may be formed using a metal or a metal nitride. In some embodiments, the etch stop layer 130 may be formed using a material having a high electrical conductivity, such as titanium, titanium nitride, tungsten, tungsten nitride, tantalum nitride, and/or titanium aluminum nitride, by a CVD process, an ALD process and/or a sputtering process. The etch stop layer 130 may be formed to have a single-layered structure or a multi-layered structure.

In some embodiments, the etch stop layer 130 may be formed to have a thickness of about 1 Å to 50 Å. Some embodiments provide that the etch stop layer 130 may be formed to have a thickness of about 5 Å to 20 Å. When the etch stop layer 130 has a thickness of less than about 5 Å, it may be difficult to control etching thickness. When the etch stop layer 130 has a thickness of greater than about 20 Å, a work function of a gate electrode may be changed.

Figure 2:
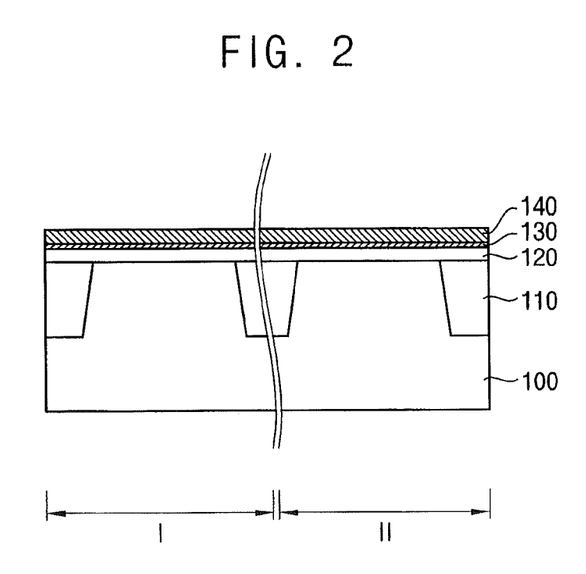

Referring to FIG. 2, a first metal layer 140 may be formed on the etch stop layer 130. The first metal layer 140 may be formed using a metal, a metal nitride and/or a metal silicide by a CVD process, an ALD process and/or a sputtering process. For example, the first metal layer 140 may be formed using molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and/or titanium aluminum nitride, among others.

In some embodiments, the first metal layer 140 may be formed using a material substantially different from that of the etch stop layer 130. For example, the first metal layer 140 may be formed using a material having an etching selectivity with respect to the etch stop layer 130.

The first metal layer 140 may be formed between the gate insulation layer 120 and a polysilicon layer that may be formed in a subsequent process so that the polysilicon layer may not directly contact the gate insulation layer 120. In this manner, a Fermi-level pinning effect may be prevented or reduced.

Figure 3:
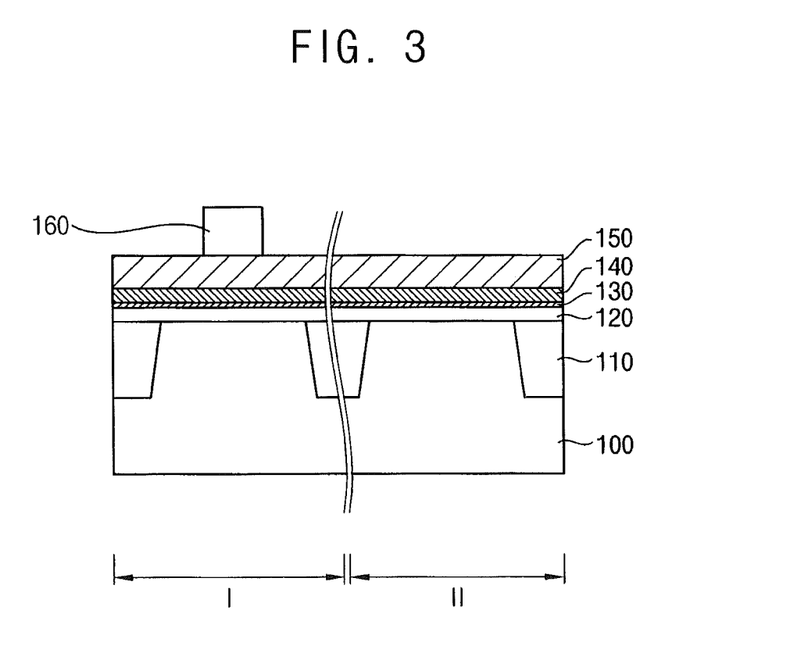

Referring to FIG. 3, a hard mask layer 150 and a mask pattern 160 may be sequentially formed on the first metal layer 140. The hard mask layer 150 may be formed on the first metal layer 140 using amorphous silicon by a sputtering process, a physical vapor deposition (PVD) process and/or a CVD process. In some embodiments, the hard mask layer 150 may be formed using amorphous silicon by a cluster-type PVD process. In this case, the process for forming the hard mask layer 150 may be performed in-situ with the process of forming the first metal layer 140.

The mask pattern 160 may be formed on the hard mask layer 150 using a photoresist pattern.

Figure 4:
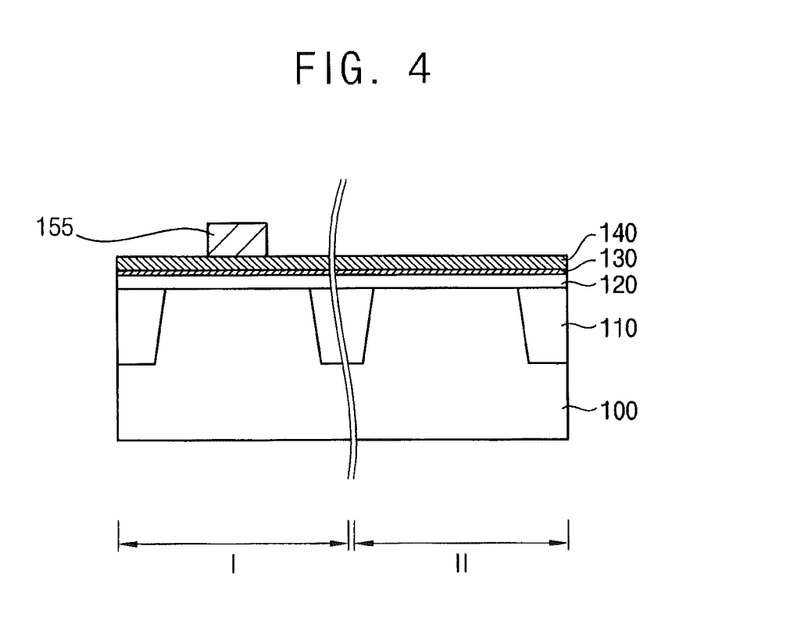

Referring to FIG. 4, a portion of the hard mask layer 150 may be etched using the mask pattern 160 as an etching mask to form a hard mask 155 in the first region I. In some embodiments, the hard mask 155 may be formed by a wet etching process using an etching solution including ammonia in a concentration of about 1% to about 50%. In some embodiments, the etching process may be performed at a temperature of about 20 to about 60° C. The etching solution including ammonia may have an etching selectivity of the hard mask layer 150 including amorphous silicon with respect to the first metal layer 140. Thus, during the etching process using the etching solution, the hard mask layer 150 may be easily removed while the first metal layer 140 may not be removed.

The mask pattern 160 may be removed by a stripping process.

Figure 5:
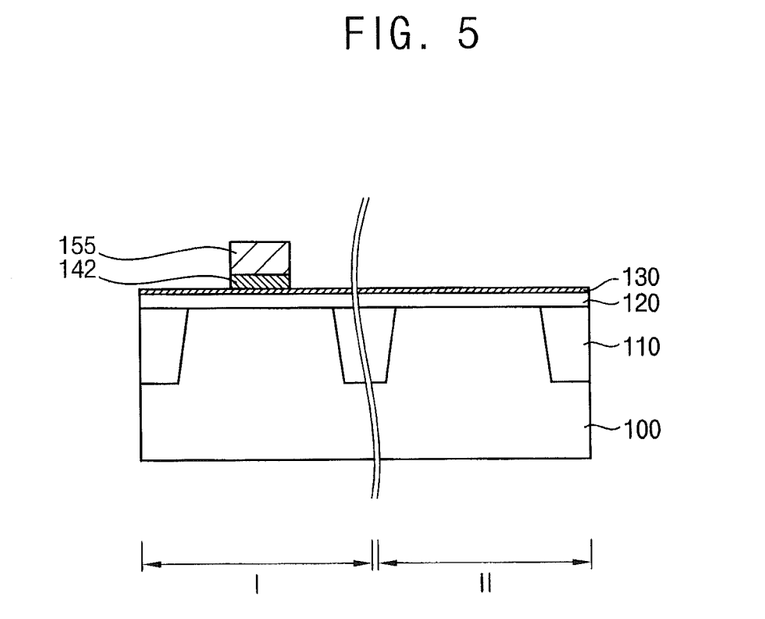

Referring to FIG. 5, a portion of the first metal layer 140 may be etched using the hard mask 155 as an etching mask to form a first metal layer pattern 142 in the first region I. The first metal layer 140 may be etched less in a lateral direction when the hard mask 155 is used as an etching mask than when a photoresist pattern is used as an etching mask. Thus, the first metal layer pattern 142 may have a relatively steep profile in a vertical direction.

The first metal layer 140 may be etched by a wet etching process or a dry etching process. In some embodiments, the first metal layer pattern 142 may be formed by a wet etching process using an etching solution including peroxide ($H_2O_2$) and ammonia water ($NH_4OH$). In some embodiments, the etching process may be performed using an etching solution including ammonia, peroxide, and distilled water in a weight ratio of about 1:1 to 5:5 to 100.

The etching solution may have a high etching rate with respect to the first metal layer 140 and a low etching rate with respect to the etch stop layer 130. That is, the first metal layer 140 may be selectively etched with the etching solution. When the first metal layer 140 is etched using the etching solution, the etch stop layer 130 may be etched slowly after the first metal layer 140 is sufficiently removed. Thus, the etch stop layer 130 may serve as a protection layer that any damage of the gate insulation layer 120 may be reduced or prevented. The etch stop layer 130 may serve as an ending point of the etching process, and the gate insulating layer 120 may not be damaged when the first metal layer 140 is etched.

Figure 6:
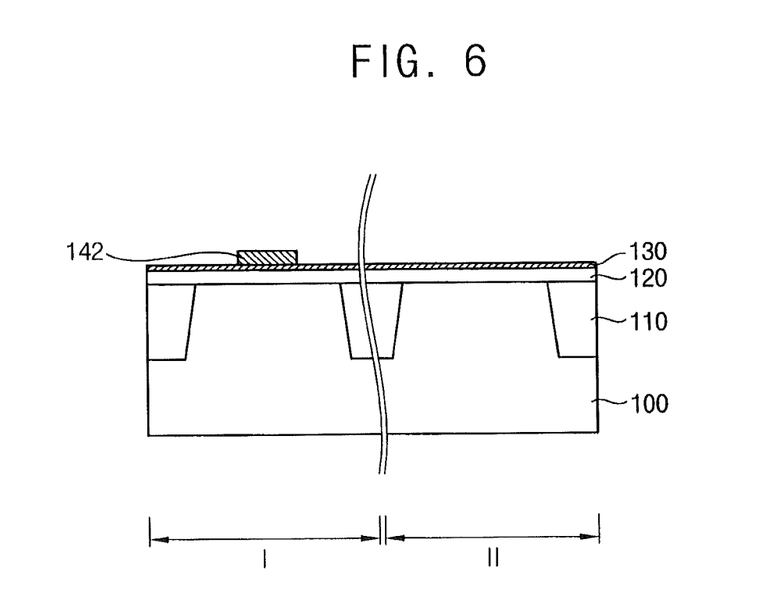

Referring to FIG. 6, the hard mask 155 in the first region I may be removed. The hard mask 155 may be removed by a wet etching process or a dry etching process. In some embodiments, the hard mask 155 may be removed by performing a wet etching process using an etching solution of ammonia water. In some embodiments, a wet etching process using a hydrogen fluoride may be further performed before the wet etching process using ammonia water. Some embodiments provide that the etching process may be performed at a temperature of about 20 to about 60° C.

In some embodiments, the hard mask 155 in the first region I may be removed by sequentially performing a first etching process using a first etching solution including hydrogen fluoride and a second etching process using a second etching solution including ammonia water. The first etching solution may remove a native oxide layer formed on a surface of the hard mask 155 and the second etching solution may remove the hard mask 155 including amorphous silicon.

The first etching solution including hydrogen fluoride may have a high etching rate with respect to the gate insulation layer 120 including an oxide or an oxynitride, such that the gate insulation layer 120 may be removed together with the hard mask 155 during the etching process of the hard mask 155 including amorphous silicon. However, in the some embodiments, the etch stop layer 130 may be formed on the gate insulation layer 120 so that the gate insulation layer 120 may not directly contact the etching solution including hydrogen fluoride. Thus, the gate insulation layer 120 may not be damaged. Also, the etch stop layer 130 may not be easily etched by the etching solution including hydrogen fluoride or the etching solution including ammonia, thereby protecting insulation layer 120 effectively.

Figure 7:
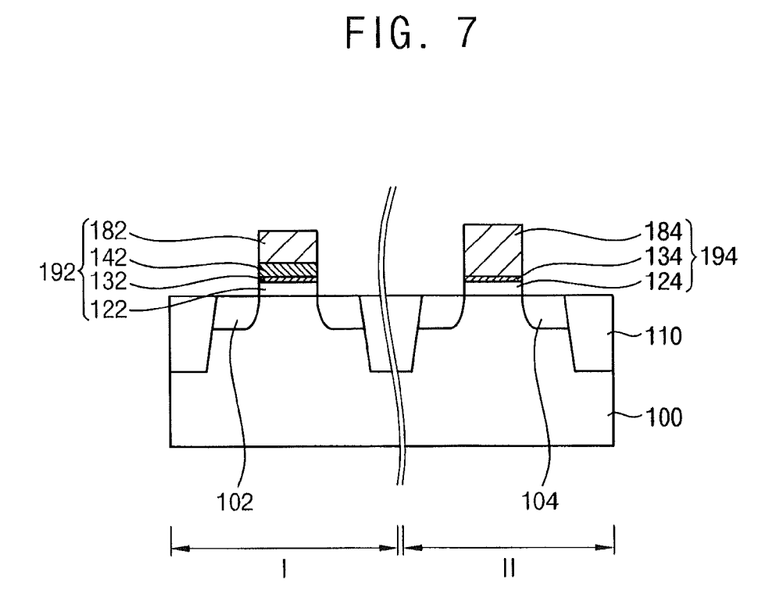

Referring to FIG. 7, the polysilicon layer may be formed on the first metal layer pattern 142 and the etch stop layer 130. The polysilicon layer, the first metal layer pattern 142, the etch stop layer 130 and the gate insulation layer 120 may be sequentially patterned using a gate mask (not shown) as an etching mask to form first and second gate structures 192 and 194 on the substrate 100 in the first and second regions I and II, respectively. The first gate structure 192 may include a first gate insulation layer pattern 122, a first etch stop layer pattern 132, a first metal layer pattern 142 and a first polysilicon layer pattern 182 sequentially stacked on the substrate 100. The second gate structure 194 may include a second gate insulation layer pattern 124, a second etch stop layer pattern 134 and a second polysilicon layer pattern 184 sequentially stacked on the substrate 100. The first and second gate structures 192 and 194 may further include the gate masks.

Impurities may be doped at an upper portion of the substrate 100 by an ion implantation process using the first and second gate structures 192 and 194 as an ion implantation mask. In some embodiments, a first source/drain region 102 including first impurities may be formed at an upper portion of the substrate 100 in the first region I, and a second source/drain region 104 including second impurities may be formed at an upper portion of the substrate 100 in the second region II, and thus the semiconductor device may be manufactured.

According to some embodiments, the etch stop layer 130 may be formed on the gate insulation layer 120 so that the gate insulation layer 120 may not be damaged during the processes for patterning the first metal layer 140 and removing the hard mask 155. When a gate electrode is etched using a photoresist pattern as an etching mask, a developable bottom anti-reflective coating (DBARC) layer pattern may be further formed below the photoresist pattern. In this case, the gate electrode may be etched in a lateral direction and the DBARC layer pattern may not be sufficiently removed from the gate electrode so that the gate electrode may have poor interface characteristics. However, in some embodiments, the gate electrode may be patterned using the hard mask 155 including amorphous silicon as an etching mask, and the DBARC layer pattern may not be used. Thus, the first metal layer pattern 152 may not be etched in a lateral direction and the first metal layer pattern 142 and the polysilicon layer pattern 182 may have good interface characteristics. The etch stop layer 130 may be formed on the gate insulation layer 120 so that any damage of the gate insulation layer 120 may be reduced or prevented during the processes for patterning the first metal layer 132 and removing the hard mask 155.

Figure 8:
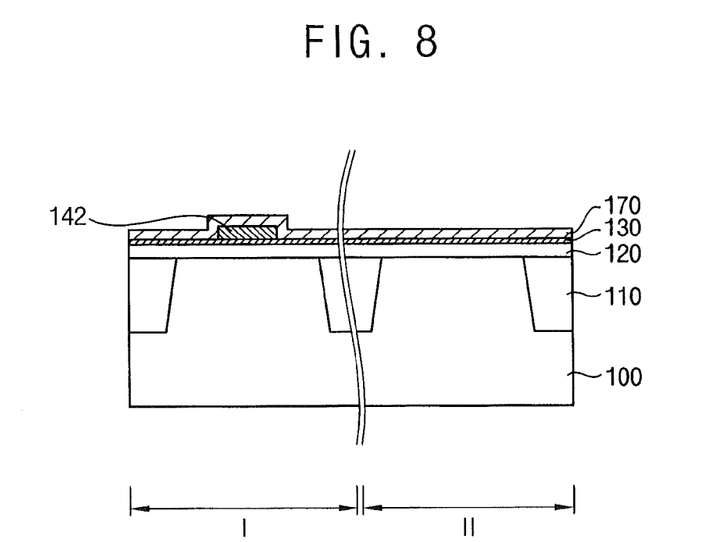
FIGS. 8 to 9 are cross-sectional views illustrating methods of manufacturing a semiconductor device in accordance with some embodiments disclosed herein.
Figure 9:
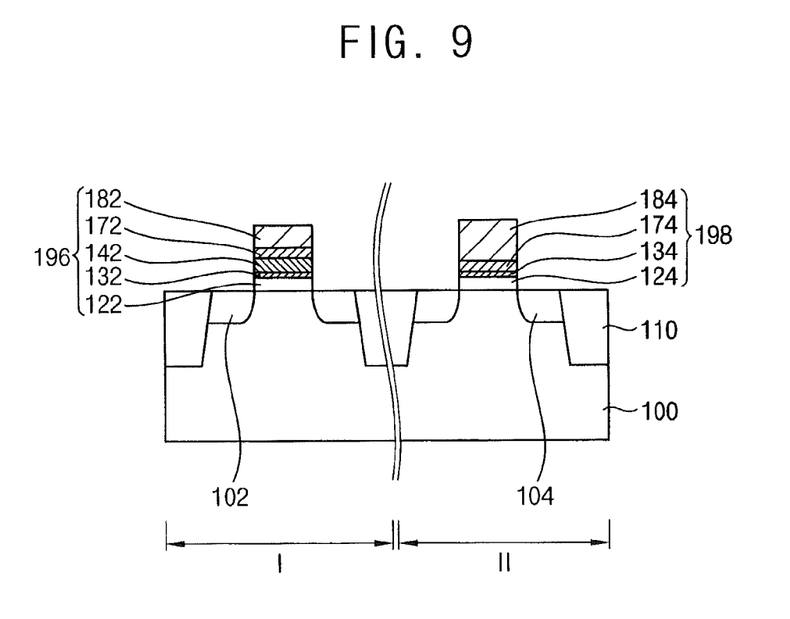

FIGS. 8 to 9 are cross-sectional views illustrating methods of manufacturing a semiconductor device in accordance with some other embodiments disclosed herein. The methods may be substantially similar to those illustrated with reference to FIGS. 1 to 7, except that a second metal layer may be further formed on the first metal layer pattern.

First, processes illustrated with reference to FIGS. 1 to 6 may be performed.

Specifically, a gate insulation layer 120, an etch stop layer 130, a first metal layer 140 and a hard mask layer 150 may be sequentially formed on a substrate 100, which may be divided into a first region I and a second region II. The hard mask layer 150 may be patterned to form a hard mask 155 in the first region I. The first metal layer 140 may be patterned using the hard mask 155 as an etching mask to form a first metal layer pattern 142 on the etch stop layer 130 in the first region I.

Referring to FIG. 8, a second metal layer 170 may be formed on the first metal layer pattern 142 and the etch stop layer 130. The second metal layer 170 may be formed using a metal, a metal nitride and/or a metal silicide by a CVD process, an ALD process and/or a sputtering process. For example, the second metal layer 170 may be formed using molybdenum, titanium, tantalum, hafnium, zirconium, aluminum, tungsten, tantalum silicide, tantalum aluminum, titanium silicide, titanium aluminum, molybdenum nitride, titanium nitride, tantalum nitride, hafnium nitride, zirconium nitride, aluminum nitride, tungsten nitride, tantalum silicide nitride, tantalum aluminum nitride, titanium silicide nitride and/or titanium aluminum nitride, among others. These may be used alone or in a combination thereof.

In some embodiments, the second metal layer 170 may be formed using a material substantially the same as that of the first metal layer 140. For example, the second metal layer 170 may be formed using a metal having a work function suitable for an NMOS transistor that may be formed in the second region II.

Referring to FIG. 9, a polysilicon layer may be formed on the second metal layer 170. The polysilicon layer, the second metal layer 170, the first metal layer 140, the etch stop layer 130, the gate insulation layer 120 may be sequentially patterned using a gate mask (not shown) as an etching mask to form a third gate structure 196 in the first region I and a fourth gate structure 198 in the second region II.

The third gate structure 196 may include a first gate insulation layer pattern 122, a first etch stop layer pattern 132, a first metal layer pattern 142, a third metal layer pattern 172 and a first polysilicon layer pattern 182 sequentially stacked on the substrate 100 in the first region I. The fourth gate structure 198 may include a second gate insulation layer pattern 124, a second etch stop layer pattern 134, a second metal layer pattern 174 and a second polysilicon layer pattern 184 sequentially stacked on the substrate 100 in the second region II. The third and fourth gate structures 196 and 198 may further include the gate masks on the first and second polysilicon layer patterns 182 and 184, respectively.

Impurities may be doped at an upper portion of the substrate 100 by an ion implantation process using the third and fourth gate structures 196 and 198 as an ion implantation mask to form first and second impurity regions 102 and 104 at upper portions of the substrate 100 adjacent the third and fourth gate structures 196 and 198, respectively. Thus, the semiconductor device may be manufactured.

FIGS. 10 to 14 are cross-sectional views illustrating methods of manufacturing a semiconductor device in accordance with some embodiments disclosed herein. The methods may be substantially similar to those illustrated with reference to FIGS. 1 to 7, except that a second metal layer may be patterned using a second hard mask.

First, processes illustrated with reference to FIGS. 1 to 6 may be performed.

Specifically, a gate insulation layer 220, an etch stop layer 230, a first metal layer and a hard mask layer may be sequentially formed on a substrate 200, which may be divided into a first region I and a second region II. The hard mask layer may be patterned to form a hard mask 255 in the first region I. The first metal layer may be patterned using the hard mask 255 as an etching mask to form a first metal layer pattern 242 on the etch stop layer 230 in the first region I.

Figure 10:
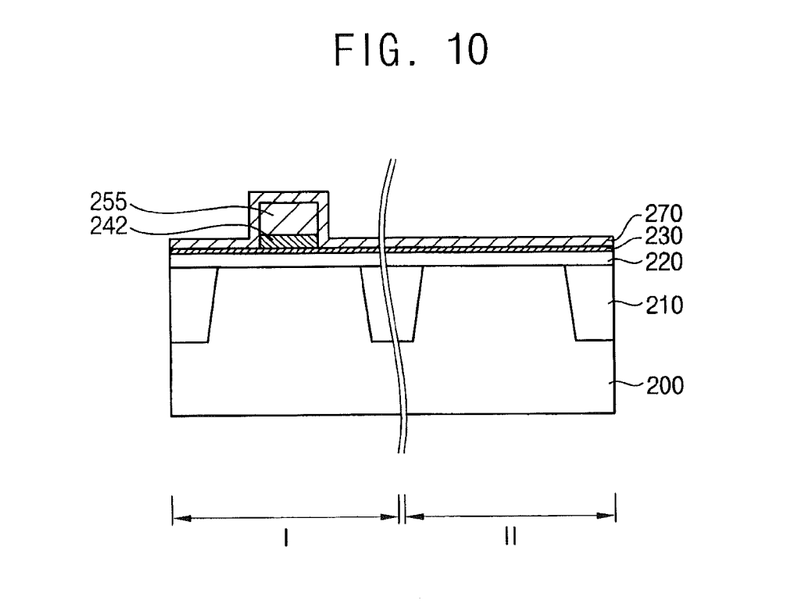
FIGS. 10 to 14 are cross-sectional views illustrating methods of manufacturing a semiconductor device in accordance with some embodiments disclosed herein.

Referring to FIG. 10, a second metal layer 270 may be formed on the first metal layer pattern 242 and the etch stop layer 230.

The second metal layer 270 may be formed using a metal, a metal nitride and/or a metal silicide by a CVD process, an ALD process and/or a sputtering process. In some embodiments, the second metal layer 270 may be formed using a material substantially the same as that of the first metal layer and thus the same as the first metal layer pattern 242. For example, the second metal layer 270 may be formed using a metal having a work function suitable for an NMOS transistor that may be formed in the second region II.

Figure 11:
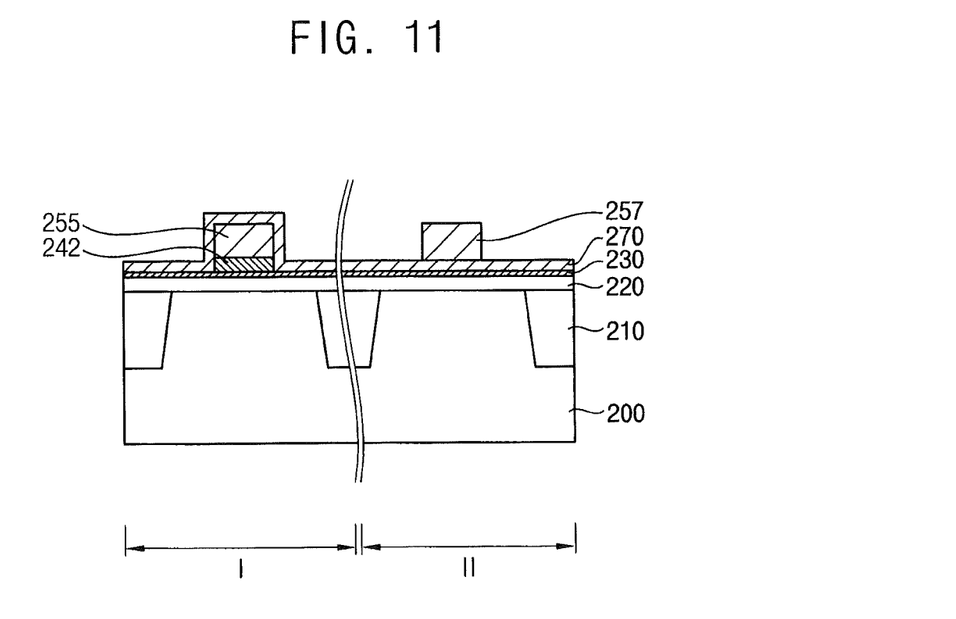

Referring to FIG. 11, a second hard mask 257 may be formed on the second metal layer 270 in the second region II using amorphous silicon. The process for forming the second hard mask 257 may be substantially the same as the process for forming the hard mask 155 illustrated with reference to FIGS. 3 to 4, and thus detailed descriptions about the process are omitted here.

Figure 12:
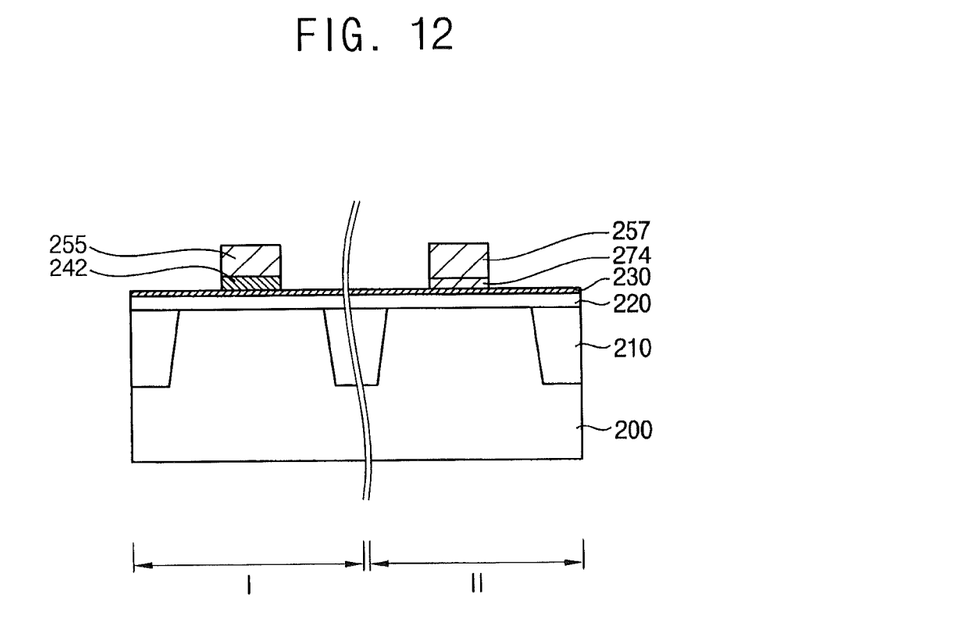

Referring to FIG. 12, the second metal layer 270 may be etched using the second hard mask 257 as an etching mask to form a second metal layer pattern 274 in the second region II. In this case, the first metal layer pattern 242 and the first hard mask 255 may remain in the first region I. In some embodiments, the second metal layer pattern 274 may be formed by a wet etching process using an etching solution including peroxide ($H_2O_2$) and ammonia water ($NH_4OH$). In some embodiments, the etching process may be performed using an etching solution including ammonia, peroxide and distilled water in a weight ratio of about 1:1 to 5:5 to 100.

Figure 13:
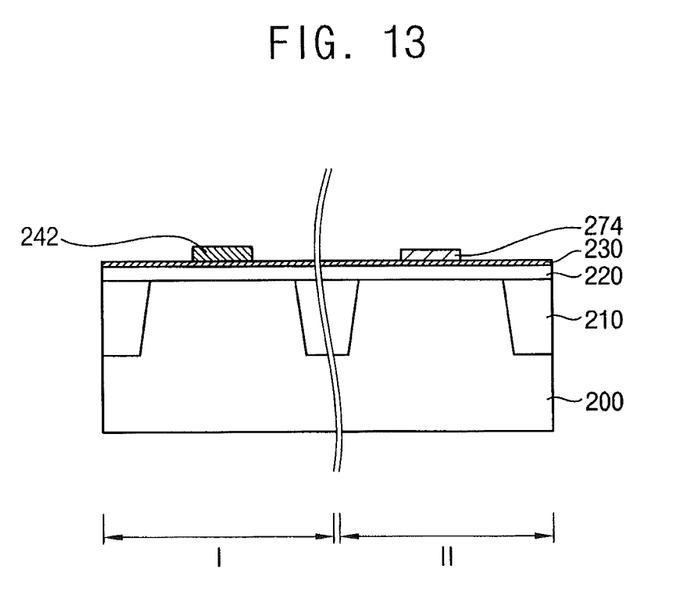

Referring to FIG. 13, the first hard mask 255 in the first region I and the second hard mask 257 in the second region II may be removed. In some embodiments, the first and second hard masks 255 and 257 may be removed by performing a wet etching process using an etching solution including ammonia water. Before the wet etching process, an additional etching process may be further performed using an etching solution including hydrogen fluoride.

Figure 14:
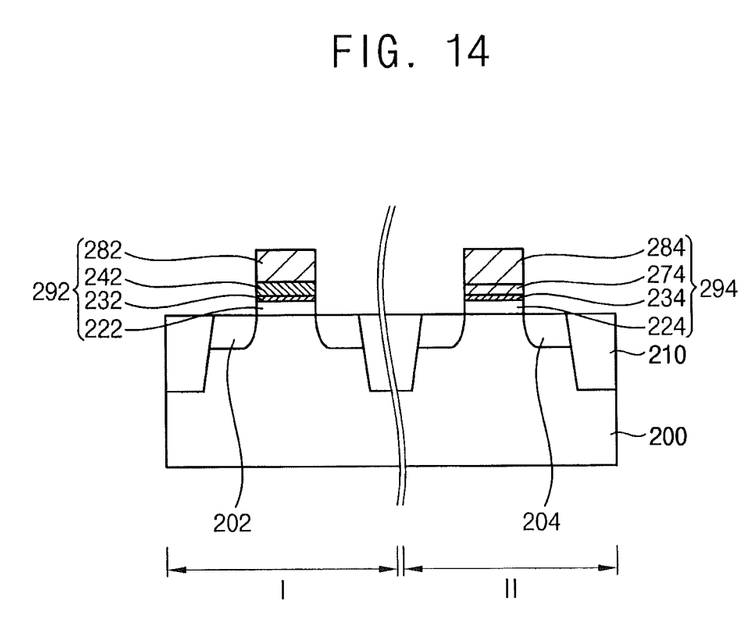

Referring to FIG. 14, a polysilicon layer may be formed on the etch stop layer 230 and the first and second metal layer patterns 242 and 274. The polysilicon layer, the first and second metal layer patterns 242 and 274, the etch stop layer 230 and the gate insulation layer 220 may be sequentially patterned using a gate mask (not shown) as an etching mask to form fifth and sixth gate structures 292 and 294 on the substrate 200 in the first and second regions I and II, respectively. The fifth gate structure 292 may include a first gate insulation layer pattern 222, a first etch stop layer pattern 232, a first metal layer pattern 242 and a first polysilicon layer pattern 282 sequentially stacked on the substrate 200. The sixth gate structure 294 may include a second gate insulation layer pattern 224, a second etch stop layer pattern 234, and a second metal layer pattern 274 and a second polysilicon layer pattern 284 sequentially stacked on the substrate 200. The fifth and sixth gate structures 292 and 294 may further include the gate masks on the first and second polysilicon layer patterns 282 and 284.

Impurities may be doped at upper portions of the substrate 200 by an ion implantation process using the fifth and sixth gate structures 292 and 294 as an ion implantation mask to form a fifth impurity region 202 and a sixth impurity region 204 at upper portions of the substrate 200 adjacent the fifth and sixth gate structures 292 and 294, respectively. Thus, the semiconductor device may be manufactured.

FIGS. 15 to 21 are cross-sectional views illustrating methods of manufacturing a semiconductor device in accordance with some other embodiments disclosed herein. In some embodiments, a CMOS transistor may be formed by performing the processes similar to those illustrated with reference to FIGS. 1 to 7.

Figure 15:
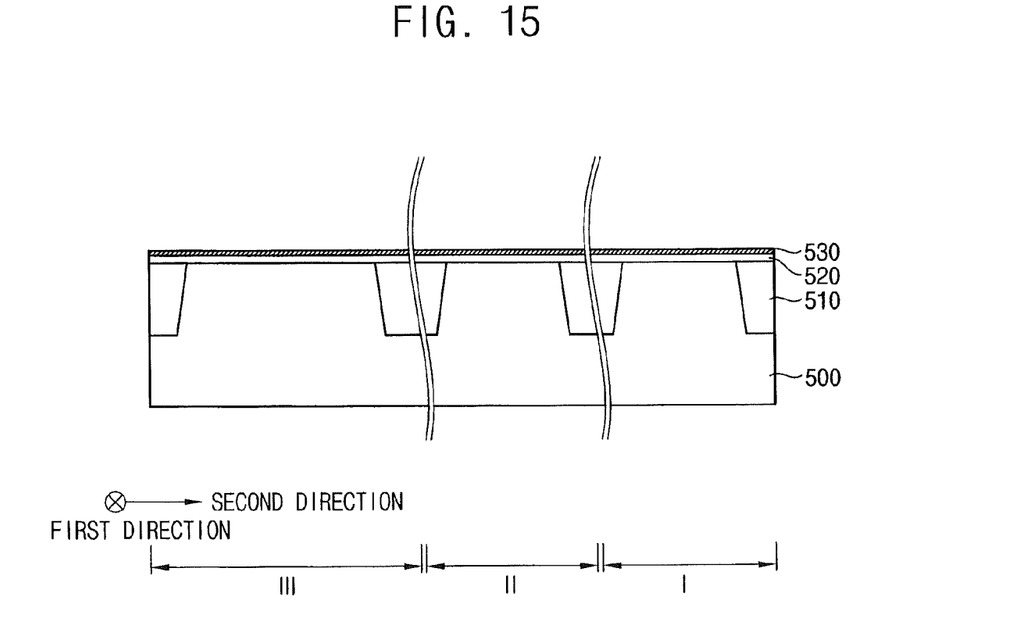
FIGS. 15 to 21 are cross-sectional views illustrating methods of manufacturing a semiconductor device in accordance with some embodiments disclosed herein.

Referring to FIG. 15, an isolation layer 510 may be formed on a substrate 500 that may include a first region I, a second region II and a third region III. The third region III may serve as a cell region, the first region I may serve as an NMOS region of a peripheral circuit region, and the second region II may serve as a PMOS region of the peripheral circuit region.

A gate insulation layer 520 and an etch stop layer 540 may be sequentially formed on the substrate 500 in all of the first to third regions I, II and III. The gate insulation layer 520 may be formed using a high-k dielectric material. In some embodiments, the gate insulation layer 520 may be formed by sequentially forming a low-k dielectric layer (not shown) and a high-k dielectric layer (not shown) on the substrate 500. The low-k dielectric layer may be formed using silicon oxide or silicon oxynitride, and the high-k dielectric layer may be formed a metal oxide or a metal oxynitride having a high dielectric constant. The etch stop layer 530 may have a single-structured layer and/or a multi-structured layer including a metal and/or a metal nitride.

Figure 16:
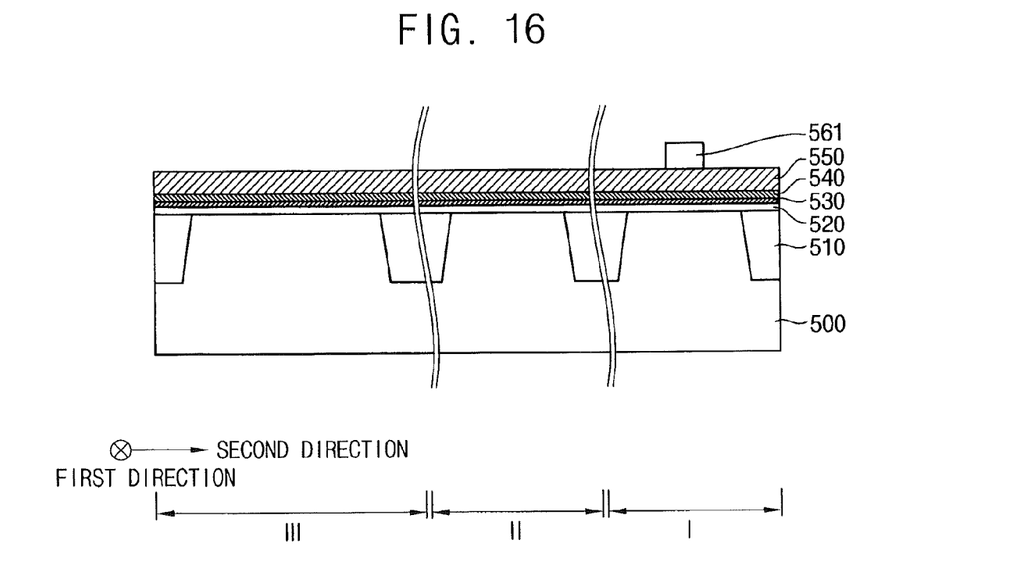

Referring to FIG. 16, a first metal layer 540 and a hard mask layer 550 may be sequentially formed on the etch stop layer 530, and a photoresist pattern 561 may be formed on the hard mask layer 550 in the first region I.

The first metal layer 540 may be formed on the etch stop layer 530 using a metal, a metal nitride and/or a metal silicide by a CVD process, an ALD process and/or a sputtering process. The hard mask layer 550 may be formed on the first metal layer 540 using amorphous silicon by a sputtering process, a PVD process and/or a CVD process.

Figure 17:
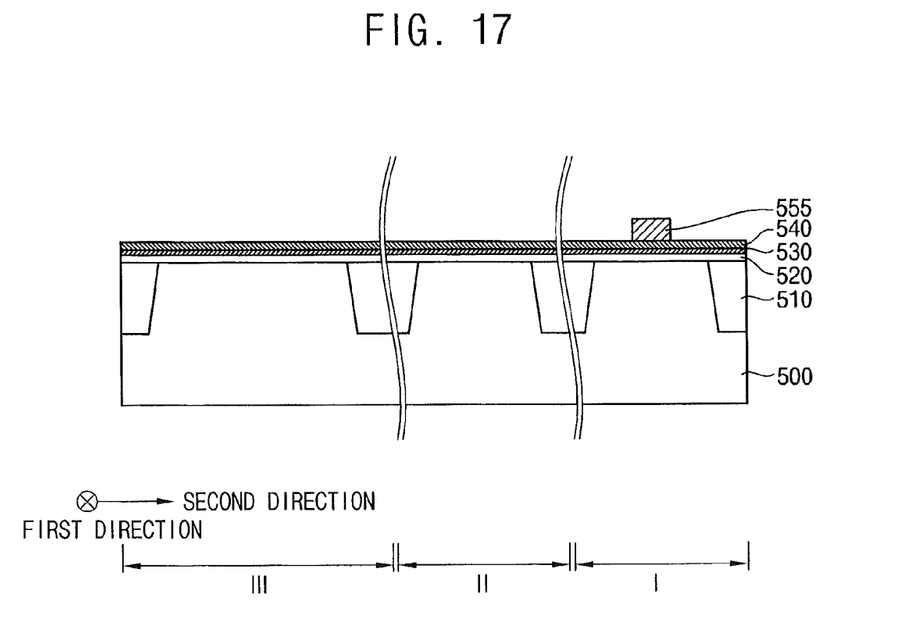

Referring to FIG. 17, a portion of the hard mask layer 550 may be etched using the photoresist pattern 561 as an etching mask to form a hard mask 555 in the first region I. In some embodiments, the hard mask 555 may be formed by performing a wet etching process using an etching solution including ammonia water of about 1 to 50%. The etching solution including ammonia water may have a high etching selectivity between the first metal layer 540 and the hard mask 555.

The photoresist pattern 561 may be removed in the first region I.

Figure 18:
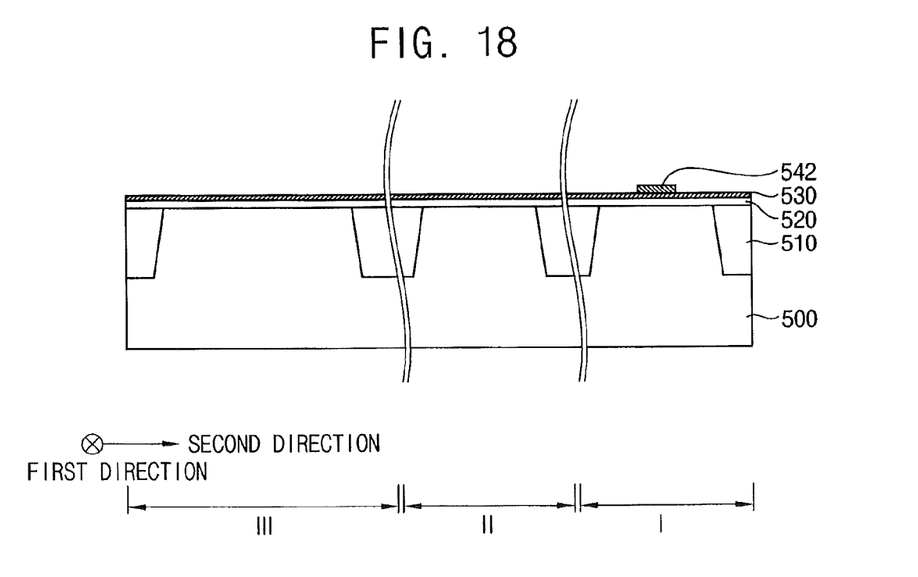

Referring to FIG. 18, a portion of the first metal layer 540 may be removed using the hard mask 555 to form a first metal layer pattern 542 in the first region I. The first metal layer pattern 542 may be formed by performing a wet etching process using an etching solution including hydrogen peroxide and ammonia water. The etching solution may have a high etching selectivity between the etch stop layer 530 and the first metal layer 540. In some embodiments, etch stop layer 530 may reduce damage of the gate insulation layer 520 that may be generated during the etching process.

Figure 19:
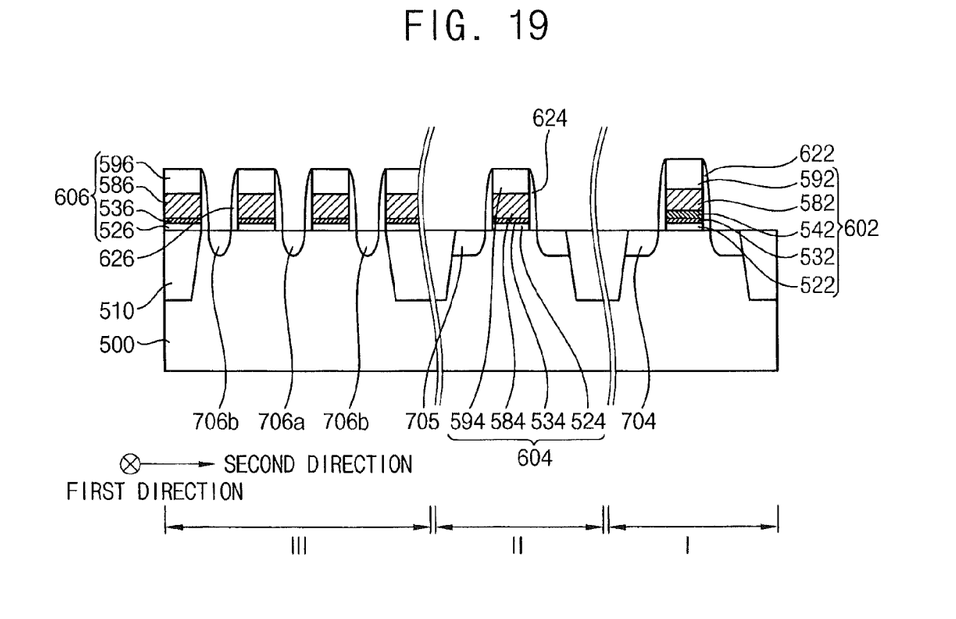

Referring to FIG. 19, a polysilicon layer may be formed on the etch stop layer 530 and the first metal layer pattern 542, and a gate mask layer may be formed on the polysilicon layer. The gate mask layer may be patterned by a photolithography process to form a first gate mask 622, a second gate mask 624 and a third gate mask 626 in the first to third regions I, II and III, respectively. The polysilicon layer, the first metal layer pattern 542, the etch stop layer 530 and the gate insulation layer 520 may be sequentially patterned using the first to third gate masks 592, 594 and 596 as an etching mask to form a first gate structure 602, a second gate structure 604 and a third gate structure 606 in the first to third regions I, II and III, respectively. In some embodiments, each of the gate structures 602, 604 and 606 may extend in a first direction, and a plurality of the gate structure 602, 604 and 606 may be formed in a second direction substantially perpendicular to the first direction. The first gate structure 602 may include a first gate insulation layer pattern 522, a first etch stop layer pattern 532, a first metal layer pattern 542, a first polysilicon layer pattern 582 and a first gate mask 592, sequentially stacked on the substrate 500 in the first region I. The second gate structure 604 may include a second gate insulation layer pattern 524, a second etch stop layer pattern 534, a second polysilicon layer pattern 584 and a second gate mask 594, sequentially stacked on the substrate 500 in the second region II. The third gate structure 606 may include a third gate insulation layer pattern 526, a third etch stop layer pattern 536, a third polysilicon layer pattern 586 and a third gate mask 596, sequentially stacked on the substrate 500 in the third region III.

A first spacer 622, a second spacer 624 and a third spacer 626 may be formed on sidewalls of the first to third gate structures 602, 604 and 606, respectively. Specifically, a spacer layer (not shown) may be formed on the substrate 500 and the isolation layer 510 to cover the first to third gate structures 602, 604 and 606, and the spacer layer may be partially removed by an anisotropic etching process to form the first to third spacers 622, 624 and 626.

A first mask (not shown) covering the first region I may be formed. Impurities may be implanted into the substrate 500 in the second and third regions II and III using the second and third gate structures 604 and 606 and the second and third spacers 624 and 626 as an ion implantation mask, so that a second impurity region 704 and a third impurity region 706 may be formed at upper portions of the substrate 500 adjacent the second and third gate structures 604 and 606, respectively. The third impurity region 706 may include a first source/drain region 706a and a second source/drain region 706b. The impurities may be n-type impurities such as phosphorous or arsenic.

The first mask may be removed.

A second mask (not shown) covering the second and third regions II and III may be formed. Impurities may be formed into the substrate 500 in the second region II using the second gate structure 604 and the second spacer 624 as an ion implantation mask to form a second impurity region 705 at an upper portion of the substrate 500 adjacent the second gate structure 604.

The second mask may be removed.

Figure 20:
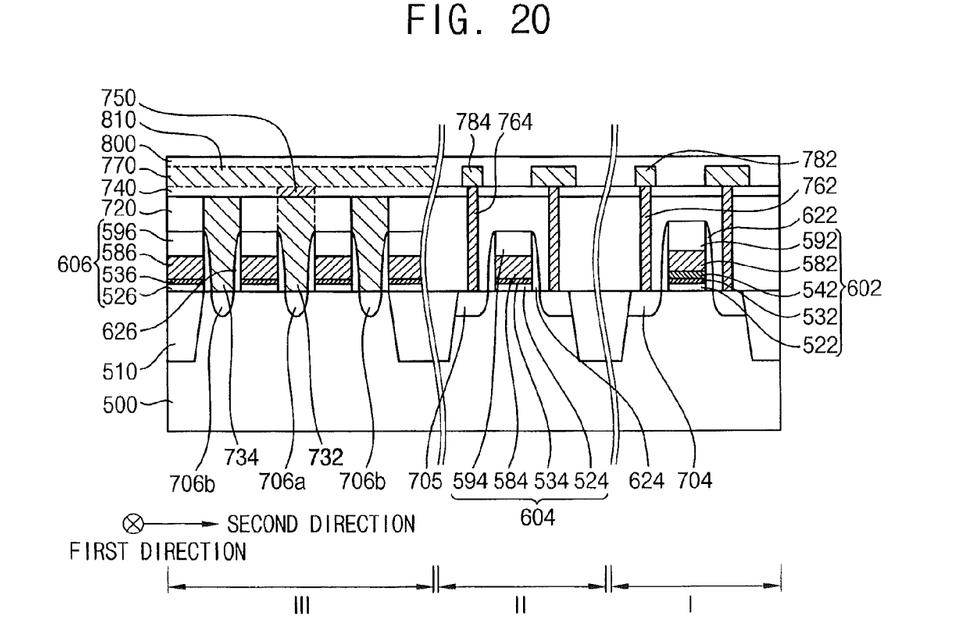

Referring to FIG. 20, a first insulating interlayer 720 may be formed on the substrate 500 to cover the gate structures 602, 604 and 606 and the spacers 622, 624 and 626. The first insulating interlayer 720 may be formed using an oxide such as borophosphor silicate glass (BPSG), undoped silicate glass (USG) and/or spin on glass (SOG), among others.

First openings (not shown) may be formed through the first insulating interlayer 720 to expose the first and second source/drain regions 706a and 706b, and a first conductive layer (not shown) may be formed on the substrate 500 and the insulating interlayer 720 to sufficiently fill the first openings. The first conductive layer may be formed using polysilicon doped with impurities, a metal, a metal nitride and/or a metal silicide. An upper portion of the first conductive layer may be planarized until an upper surface of the first insulating interlayer 720 is exposed to form first and second plugs 732 and 734 to which the first and second source/drain regions 706a and 706b may be electrically connected.

A second insulating interlayer 740 may be formed on the first insulating interlayer 720 and the first and second plugs 732 and 734. Second openings (not shown) may be formed through the second insulating interlayer 740 to expose the first plug 732 and the first and second impurity regions 704 and 705. A second conductive layer (not shown) may be formed on the substrate 500, the first plug 732 and the second insulating interlayer 740 to sufficiently fill the second openings. The second conductive layer may be formed using polysilicon doped with impurities, a metal, a metal nitride and/or a metal silicide. An upper portion of the second conductive layer may be planarized until an upper surface of the second insulating interlayer 740 is exposed to form a bitline contact plug 750, a third plug 762 and a fourth plug 764 which may be electrically connected to the first plug 732, the first impurity region 704 and the second impurity region 705, respectively.

A third conductive layer (not shown) may be formed on the second insulating interlayer 740 to contact the bitline contact plug 750 and the third and fourth plugs 762 and 764, and then may be patterned to form a bitline 770 to which the bitline contact 750 may be connected and first and second wirings 782 and 784 to which the third and fourth plugs 762 and 764 may be connected. In some embodiments, the bitline 770 may be formed to extend in the second direction. The third conductive layer may be formed using polysilicon doped with impurities, a metal, a metal nitride and/or a metal silicide.

A third insulating interlayer 800 may be formed on the second insulating interlayer 740 to cover the bitline 770, the first wiring 782 and the second wiring 784.

Figure 21:
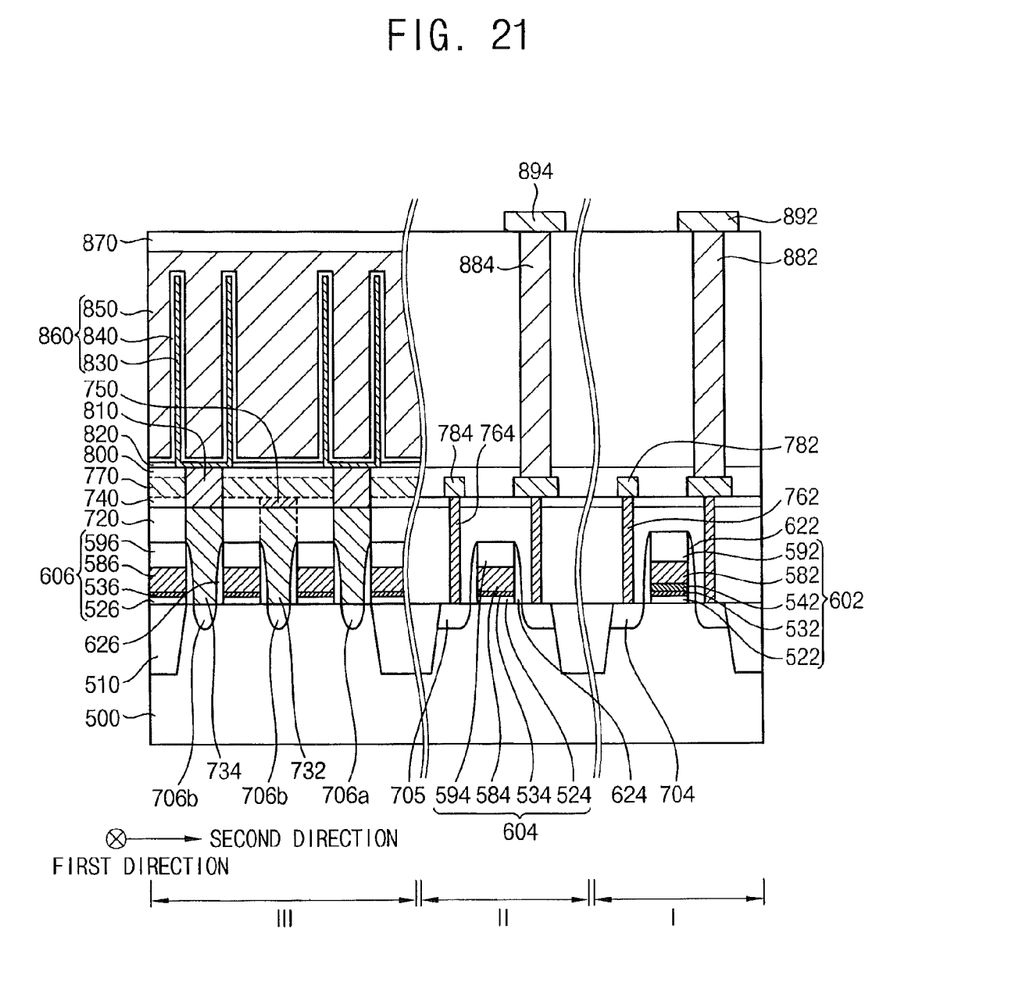

Referring to FIG. 21, third openings (not shown) may be formed through the second and third insulating interlayers 740 and 800 to expose the second plugs 734. The fourth conductive layer (not shown) may be formed on the second plugs 734 and the third insulating interlayer 800 to sufficiently fill the third openings. The fourth conductive layer may be formed using polysilicon doped with impurities, a metal, a metal nitride and/or a metal silicide. An upper portion of the fourth conductive layer may be planarized until an upper surface of the third insulating interlayer 800 is exposed to form capacitor contact plugs 810 to which the second plugs 734 may be electrically connected.

An etch stop layer 820 and a mold layer (not shown) may be sequentially formed on the capacitor contact plugs 810 and the third insulating interlayer 800. In some embodiments, the etch stop layer 820 may be formed using silicon nitride and the mold layer may be formed using silicon oxide. Fourth openings (not shown) may be formed through the mold layer and the etch stop layer 820 to expose the capacitor contact plugs 810. A fifth conductive layer (not shown) may be formed on bottoms and sidewalls of the fourth openings and the mold layer, and a sacrificial layer (not shown) may be formed on the fifth conductive layer to sufficiently fill the fourth openings. The fifth conductive layer may be formed using polysilicon doped with impurities, a metal, a metal nitride and/or a metal silicide. Upper portions of the sacrificial layer and the fifth conductive layer may be planarized until an upper surface of the mold layer is exposed, and then, the sacrificial layer and the mold layer may be removed. Thus, multiple lower electrodes 830 may be formed on the bottoms and sidewalls of the fourth openings.

A dielectric layer 840 may be formed on the lower electrodes 830 and the etch stop layer 820. The dielectric layer 840 may be formed using silicon nitride or a high-k dielectric material having a dielectric constant higher than that of silicon nitride, such as tantalum oxide, hafnium oxide, aluminum oxide and/or zirconium oxide, among others.

An upper electrode 850 may be formed on the dielectric layer 840. The upper electrode 850 may be formed using polysilicon doped with impurities, a metal, a metal nitride and/or a metal silicide.

The lower electrode 830, the dielectric layer 840 and the upper electrode 850 may define a capacitor 860.

A fourth insulating interlayer 870 may be formed on the third insulating interlayer 800 to cover the capacitor 860. Fifth openings (not shown) may be formed through the fourth insulating interlayer 870 to expose the first and second wirings 782 and 784. A sixth conductive layer (not shown) may be formed on the first and second wirings 782 and 784 and the fourth insulating interlayer 870 to sufficiently fill the fifth openings. An upper portion of the sixth conductive layer may be planarized until an upper surface of the fourth insulating interlayer 870 is exposed to form fifth and sixth plugs 882 and 884 which may be electrically connected to the first and second wirings 782 and 784, respectively.

Third and fourth wirings 892 and 894 may be formed on the fourth insulating interlayer 870 to be electrically connected to the fifth and sixth plugs 882 and 884, respectively. A protection layer (not shown) may be further formed on the fourth insulating interlayer 870 to protect the third and fourth wirings 892 and 894, and thus the semiconductor device may be manufactured.

According to some embodiments, the semiconductor device having the CMOS transistor may have good electrical characteristics.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing semiconductor devices, comprising:
    forming a gate insulation layer including a high-k dielectric material on a substrate, the substrate including a first region and a second region;
    forming an etch stop layer on the gate insulation layer;
    forming a first metal layer on the etch stop layer;
    forming a first hard mask including amorphous silicon on the first metal layer in the first region;
    removing the first metal layer using the first hard mask as an etching mask until the etch stop layer is exposed to form a first metal layer pattern on the etch stop layer in the first region;
    forming a second metal layer on the first hard mask and the etch stop layer;
    forming a second hard mask on the second metal layer in the second region; and
    removing the second metal layer using the second hard mask as an etching mask until the etch stop layer is exposed to form a second metal layer pattern on the etch stop layer in the second region.

2. The method according to claim 1, wherein forming the first hard mask includes:
    forming a first hard mask layer including amorphous silicon on the first metal layer;
    forming a photoresist pattern on the first hard mask layer in the first region; and
    patterning the first hard mask layer using the photoresist pattern as an etching mask.

3. The method according to claim 2, wherein patterning the first hard mask layer includes performing a first wet etching process using an etching solution including ammonia and water.

4. The method according to claim 3, wherein patterning the first hard mask layer further includes performing a second wet etching process using an etching solution including hydrogen fluoride, before performing the first wet etching process.

5. The method according to claim 1, wherein removing the first metal layer is performed by a wet etching process using an etching solution including ammonia, hydrogen peroxide and distilled water.

6. The method according to claim 1, wherein the etch stop layer is formed at a thickness of less than about 20 Å using tantalum or tantalum nitride.

7. The method according to claim 1, further comprising:
    removing the first and second hard masks;
    forming a polysilicon layer on the first and second metal layer patterns and the etch stop layer; and
    patterning the polysilicon layer, the first and second metal layer patterns, the etch stop layer and the gate insulation layer to form a first gate structure in the first region and a second gate structure in the second region.

8. The method according to claim 1, wherein forming the second hard mask comprises forming the second hard mask including amorphous silicon.

* * * * *